United States Patent
Ambroggi

(10) Patent No.: US 7,548,477 B2
(45) Date of Patent: Jun. 16, 2009

(54) METHOD AND APPARATUS FOR ADAPTING CIRCUIT COMPONENTS OF A MEMORY MODULE TO CHANGING OPERATING CONDITIONS

(75) Inventor: Luca de Ambroggi, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 205 days.

(21) Appl. No.: 11/135,611

(22) Filed: May 23, 2005

(65) Prior Publication Data

US 2006/0262591 A1    Nov. 23, 2006

(51) Int. Cl.
G11C 11/4074    (2006.01)
G11C 7/04    (2006.01)

(52) U.S. Cl. .......................... 365/212; 365/211; 365/51; 365/72; 365/63; 365/229; 365/228; 365/227

(58) Field of Classification Search ................... 365/72, 365/63, 51, 206, 229, 228, 227, 226, 189.02, 365/189.08, 189.09, 212, 211
See application file for complete search history.

(56) References Cited

U.S. PATENT DOCUMENTS

| | | | | |
|---|---|---|---|---|
| 5,495,452 | A * | 2/1996 | Cha | 365/222 |
| 5,875,142 | A | 2/1999 | Chevallier | 365/212 |
| 6,011,725 | A | 1/2000 | Eitan | 365/185.33 |
| 6,438,057 | B1 * | 8/2002 | Ruckerbauer | 365/222 |
| 6,457,093 | B2 | 9/2002 | Roohparvar | 711/103 |
| 6,775,196 | B2 * | 8/2004 | Perner et al. | 365/211 |
| 6,776,196 | B2 | 8/2004 | Yamakawa | |
| 6,967,884 | B2 * | 11/2005 | Hsu | 365/211 |
| 7,082,070 | B2 * | 7/2006 | Hong | 365/211 |
| 7,260,007 | B2 * | 8/2007 | Jain et al. | 365/212 |
| 2001/0042159 | A1 | 11/2001 | Roohparvar | 711/103 |
| 2003/0155974 | A1 | 8/2003 | Ivanov et al. | 330/256 |
| 2003/0155975 | A1 | 8/2003 | Ivanov et al. | 330/256 |
| 2004/0251959 | A1 | 12/2004 | Ivanov et al. | 330/2 |
| 2005/0259496 | A1 * | 11/2005 | Hsu et al. | 365/226 |

FOREIGN PATENT DOCUMENTS

| | | |
|---|---|---|
| DE | 42 24 048 A1 | 8/1993 |
| DE | 4224048 A1 * | 8/1993 |
| FR | 2857091 | 1/2005 |
| FR | 2857091 A1 * | 1/2005 |

OTHER PUBLICATIONS

Bez, Roberto, et al., "Introduction to Flash Memory," Proceedings of the IEEE, vol. 91, No. 4, Apr. 2003, pp. 489-502.

* cited by examiner

*Primary Examiner*—Andrew Q Tran
(74) *Attorney, Agent, or Firm*—Slater & Matsil, L.L.P.

(57) ABSTRACT

A method adapts circuit components of a memory module to changing operating conditions within a predefined range. According to one embodiment, a memory module provides a sensor arrangement and a communication bus. Sub-ranges are defined for at least one operating condition, in which the circuit components can work with a fixed setup. During operation, the current state of the at least one operating condition is sensed using the sensing arrangement. The sensed state of the operating condition is mapped to one of the predefined ranges and an associated set of control signals is transmitted over the communication bus. The control signals transmitted over the communication bus are used to adapt at least one circuit component to the current operating conditions.

9 Claims, 7 Drawing Sheets

| Range | Supply voltage $V_{CC}$ | Control signal |
|---|---|---|
| R0 | 1.4 - 1.5 V | 000 |
| R1 | 1.5 - 1.6 V | 001 |
| R2 | 1.6 - 1.7 V | 010 |
| R3 | 1.7 - 1.8 V | 011 |
| R4 | 1.8 - 1.9 V | 100 |
| R5 | 1.9 - 2.0 V | 101 |
| R6 | 2.0 - 2.1 V | 110 |
| R7 | 2.1 - 2.2 V | 111 |

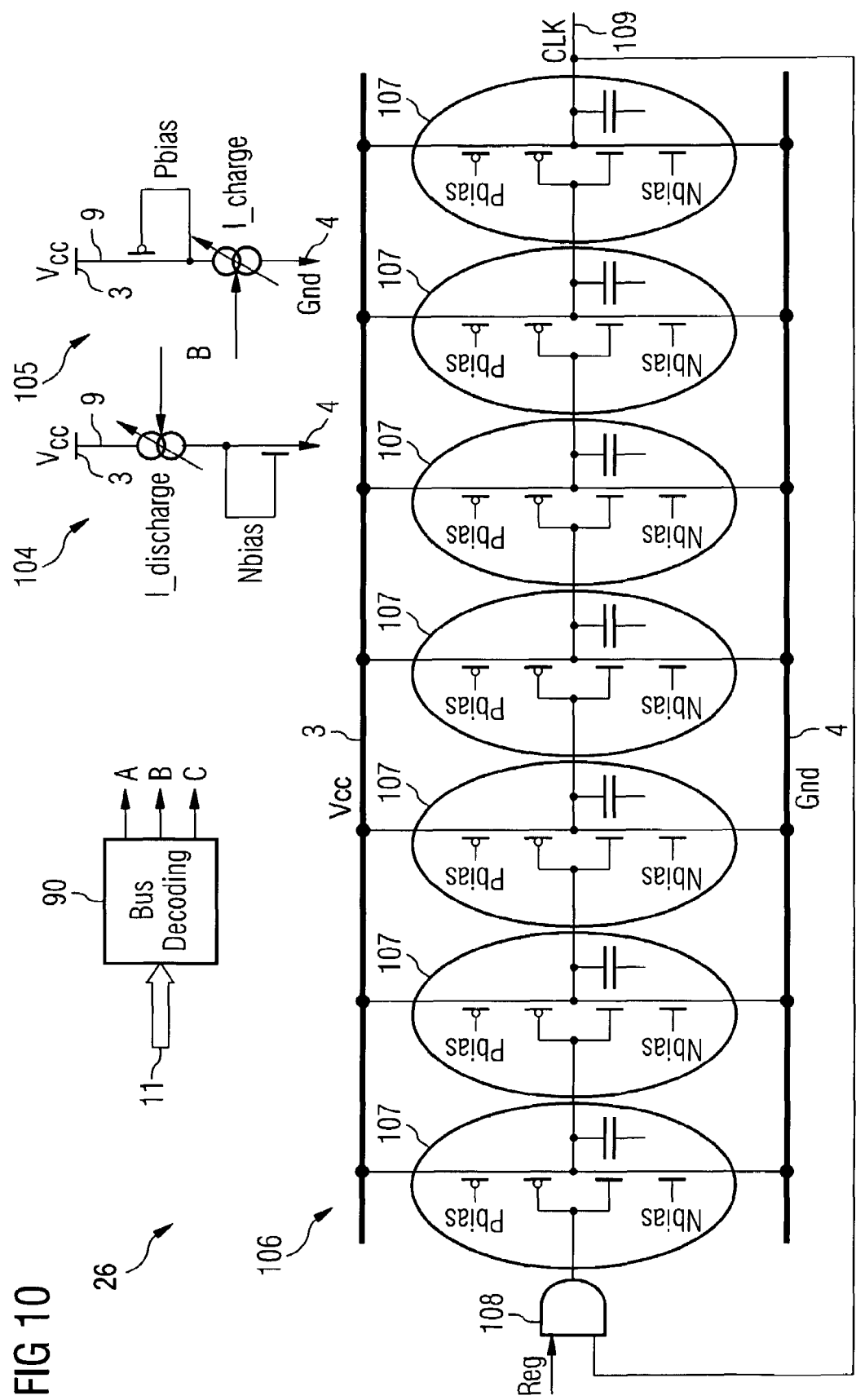

METHOD AND APPARATUS FOR ADAPTING CIRCUIT COMPONENTS OF A MEMORY MODULE TO CHANGING OPERATING CONDITIONS

TECHNICAL FIELD

The invention relates to semiconductor memory modules in general and to their operation under changing operating conditions in particular.

BACKGROUND

Memory modules comprise a multiplicity of electronic components and circuits, typically integrated into an integrated circuit (IC). Electric components in general and semiconductors in particular change their behavior in response to changing operating conditions, e.g., changing temperature, supply voltage level and so on.

The ever increasing package density of ICs increases this effect even further, with individual structures of a semiconductor being pushed closer to physical boundaries. In parallel, the voltage levels decrease in order to save power. This often results in a poor signal-to-noise ratio.

At the same time, the use of electronic devices in mobile environments makes it harder to control the operating conditions under which the electronic devices are used. Battery powered devices are subject to changing supply voltage levels as batteries are charged and discharged.

Devices used outdoors can experience big changes in operating temperature, pressure or humidity. Users expect their mobile devices to cope with such changes. Consequently, the demand for electronic components, which are independent of such changing operating conditions, rises.

This problem is particularly relevant for memory modules, as they exhibit a very high package density and are operated at very low supply voltages, e.g., down to 1.8 V. Because of their mechanical robustness, semiconductor memory modules are used in many portable devices, e.g., as built-in storage of personal media players or on exchangeable memory cards used for digital cameras.

It is known to adapt individual circuit components of a memory module. For example, the time used to sense the state of a memory cell can be increased for memory modules designed to operate at a low supply voltage level. This is useful in a circuit where a bit line of a memory cell is discharged over a sense amplifier. Since the supply voltage and consequently the gate voltage used to enable the discharge path are relatively low, e.g., in comparison with a memory module operated with a higher supply voltage, the discharge process will take longer.

A timing circuit used to control the sense amplifier could be trimmed, for example, by adding or removing elements of a delay chain. However, since different electronic circuits of a memory module react differently to changing operating conditions, each circuit component is adapted individually. This often leads to complex designs comprising redundant solutions, costing valuable design time and chip area. As a consequence not all the electronic components can be adapted to operating conditions.

Consequently, there exists a need for memory modules or for other circuitry in general with a simple circuit design, which can be used in a wide range of operating conditions.

SUMMARY OF THE INVENTION

According to one aspect of the current invention, a method is provided for adapting circuit components of a memory module to changing operating conditions. According to the method, a sensor arrangement and a communication bus are provided, which are used to sense the current state of at least one operating condition.

The sensed state is mapped to one of multiple predefined ranges of the operating conditions. These ranges are designed in such a way that the circuit component can operate within them without further trimming, i.e., with a fixed circuit setup. Each predefined range has an associated set of control signals. The control signals associated with the range are transmitted using the communication bus to all circuit components that are to be adapted to the current operating condition. In a last step, the provided control signals are used by the individual circuit components to trim the circuit component to the actual operating condition.

According to one aspect of the current invention, the circuit components are adapted to the current operating temperature of the memory module.

According to another aspect of the invention, the circuit components are adapted to the current supply voltage provided to the memory module.

According to embodiments of the present invention the operating conditions of a memory module are subdivided into discrete ranges in which the memory module can operate without changes. Changes in the monitored operating conditions within this range do not require a change of the circuit. Only if a change in the monitored operating condition exceeds one predefined range, an evaluation means provides a new set of control signals via the communication bus. Thus, all circuit components of the memory module are trimmed to the new operating condition using the same set of control signals.

In this way, the part of the circuit used to monitor an operating condition and to initiate a trimming of circuit components can be centralized and only needs to exist once in the memory module.

According to one aspect of the current invention, a new dedicated communication bus is used to distribute the control signals from the sensing arrangement to the circuit components.

According to another aspect of the current invention, an existing communication bus connecting a memory module's internal controller with the circuit components is used to transmit the control signals.

Further attractive aspects and details of the current invention are recited in the patent claims and discussed by means of a preferred embodiment.

BRIEF DESCRIPTION OF THE DRAWINGS

The invention will be described in detail hereinafter with reference to the figures described below:

FIG. 10 show a schematic design of a clock generator, which can be adapted by means of control signals received from a communication bus.

DETAILED DESCRIPTION OF ILLUSTRATIVE EMBODIMENTS

Figures 1, 2:
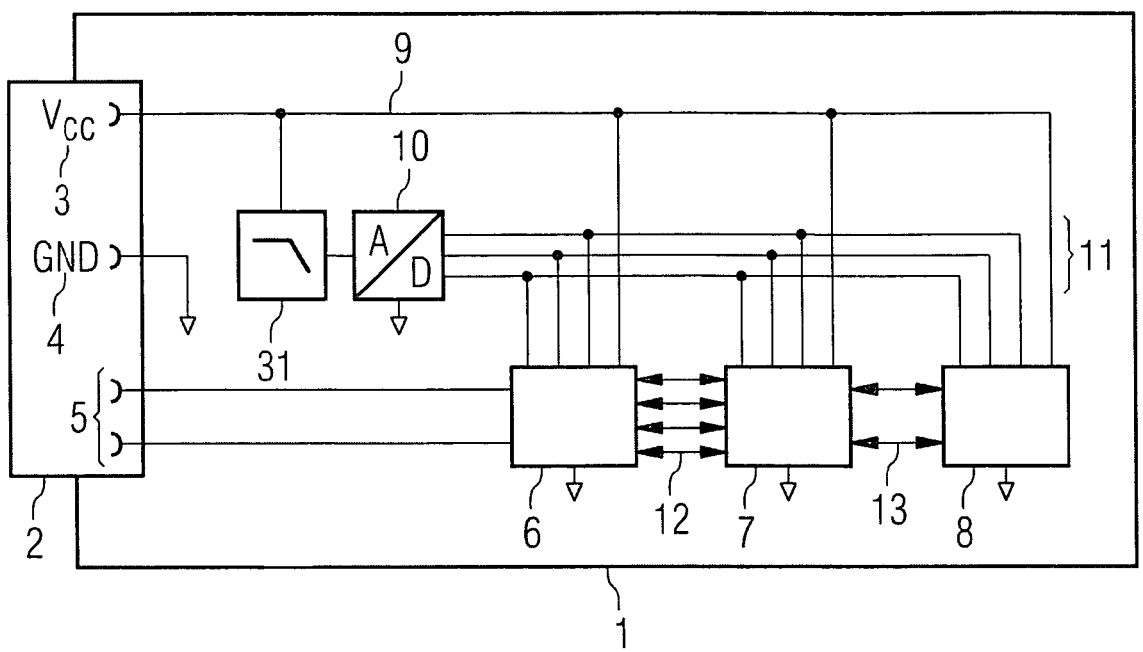
FIG. 1 shows a schematic setup of a first embodiment of the present invention, in which a separate communication bus is used to transmit control signals for the adaptation of circuit components to a current supply voltage level of a memory module.
FIG. 2 shows a table mapping the supply voltage of a memory card to discrete voltage ranges and associated control signals.

FIG. 1 shows a memory device 1 with an interface 2. The interface 2 comprises connectors for a supply voltage ($V_{CC}$) 3, electrical ground (GND) 4 and a data and control bus 5. The memory device 1 further comprises three circuit components 6, 7, and 8. For example, the circuit component 6 may be an interface controller used to exchange data via the interface 2, the circuit component 7 may be a peripheral circuit arrangement used to control a memory cell array 8. These components 6, 7 and 8 can be implemented in three integrated circuit chips, or in more or in fewer.

All circuit components 6, 7, and 8 are coupled to the supply voltage 3 by means of an electrical connection 9. In addition, an analog-to-digital (AD) converter 10 is connected to the power supply line 9 over a low-pass filter 31. The low-pass filter 31 removes short-time voltage drops, noise and coupling occurring on the power line 9, e.g. to the lines of the data and control bus 5. The AD converter 10 converts the filtered supply voltage level of the power supply line 9 into a digital signal and provides it over the communication bus 11.

All three circuit components 6, 7, and 8 are coupled to the communication bus 11. In addition, the circuit components 6 and 7 are coupled by a first internal bus 12 and the circuit components 7 and 8 are coupled by a second internal bus 13. Finally, the circuit component 6 is coupled to the interface 2 by means of the bi-directional data and control bus 5.

The embodiment shown in FIG. 1 is used to monitor the level of the supply voltage 3 provided to the memory device 1 using the connector 3 of the interface 2. The current level of the supply voltage 3 is converted into a digital signal using the AD converter 10 and provided to one, some or all of the circuit components 6, 7, and 8. Consequently, the circuit components 6, 7, and 8 can adapt themselves to the current supply voltage 3, for example using a different timing during a sensing, programming or erasing phase or by increasing or decreasing a gate voltage provided to a selected cell of the memory array 8.

As a consequence, the memory device 1 becomes independent from variations of the supply voltage 3 over a large range of provided supply voltages.

FIG. 2 shows a table detailing an exemplary mapping between ranges of supply voltages $V_{CC}$ 3 and the associated control signals 14 provided over the communication bus 11. In the given example, the memory device 1 is designed to operate with a supply voltage 3 of 1.8 V. However, the memory device 1 should also cope with variations in the supply voltage 3 of ±+/−0.4 V, e.g., with a supply voltage range ranging from 1.4 to 2.2 V. FIG. 2 shows that this range of supply voltages 3 is subdivided into eight ranges R0 to R7, each of which covers a sub-range of 0.1 V. For example, the range R5 covers a supply voltage level from 1.9 to 2.0 V. The range R5 has the associated control signal pattern of "101", which is distributed over the communication bus 11. For example, a high voltage level can be provided on a first and third line of the communication bus 11 and a low voltage level can be provided on a second line of the bus 11. It is understood that other codes could alternatively be used.

Figure 3:
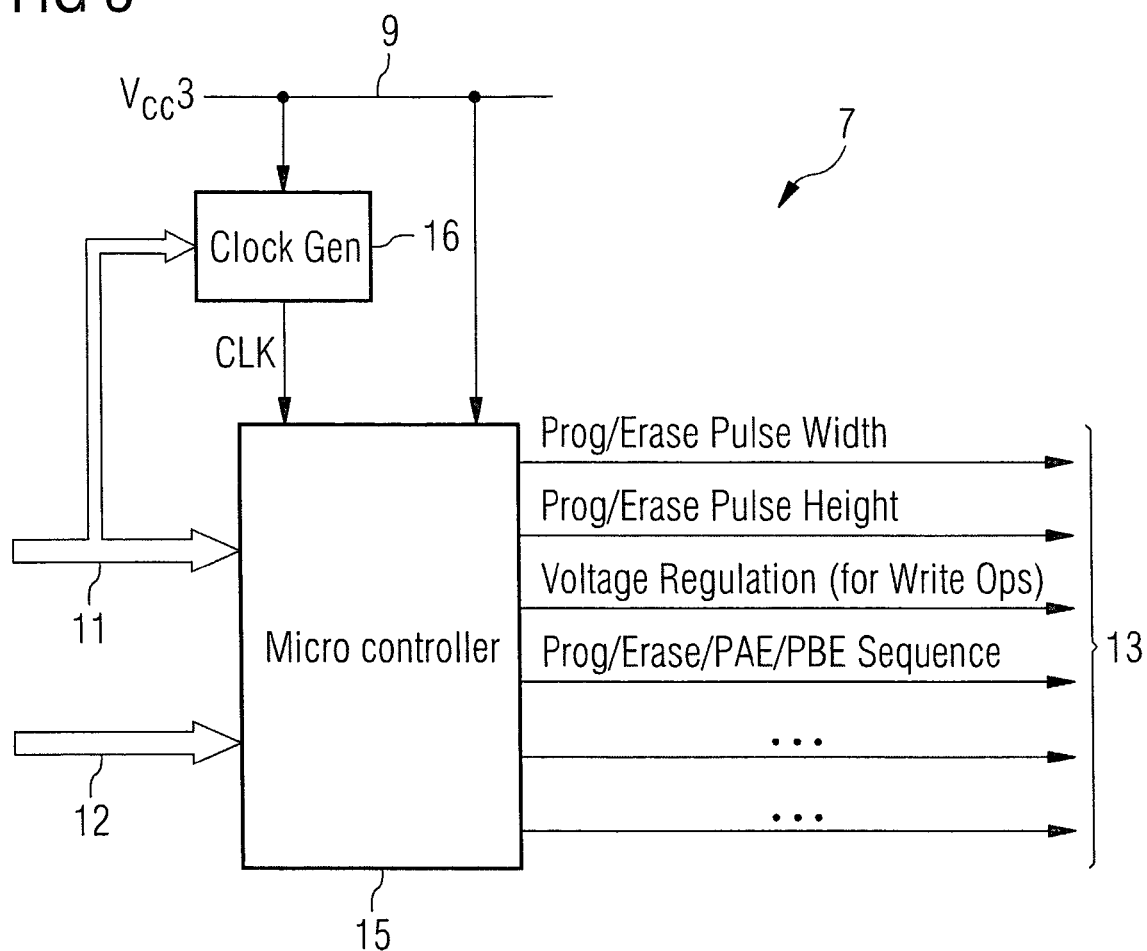
FIG. 3 shows a schematic diagram of a micro-controller, which is used to control the voltage pulses required for programming and erasing of memory cells and which can be adapted by means of control signals received from a communication bus.

FIG. 3 shows a schematic diagram of a micro-controller 15 with incoming and outgoing control lines. Such a micro-controller 15 could be, for example, part of the peripheral circuit arrangement 7. The micro-controller 15 receives control signals from the communication bus 11 and the first internal bus 12. The micro-controller 15 also receives a clock signal from a clock generator 16, which in turn is also coupled to the communication bus 11. Both the micro-controller 15 and the clock generator 16 are supplied with supply voltage 3 by means of the power supply line 9.

The micro-controller 15 provides control outputs for the programming and erasing pulse width and heights, their voltage levels and their signal sequences. These signals are provided to the second internal bus 13. Using these signals, the micro-controller 15 can control all phases of the programming and erasing of memory cells. For example, during deletion of flash memory cells, the micro-controller 15 first programs all previously erased cells by repeatedly providing programming pulses of known height and width to a cell until a predefined threshold is reached. Once all memory cells are programmed, they are erased together using erasing pulses, whose width and height is also controlled by the micro-controller 15.

Because different cells react slightly differently to the common erasing pulses, some cells will be over-erased at the end of this cycle. Thus, each cell is soft programmed individually to another predefined threshold at the end of this procedure. The sequence and parameters of all pulses used during this three phase erasing procedure is controlled by the micro-controller 15 and can be adapted to the current operating conditions by means of the control signals provided via the communication bus 11.

The micro-controller 15 can be programmed to counterbalance known variations of the controlled circuit components. For example, the conductivity of conductors is usually lowered, whereas the conductivity of semiconductors is increased for an increased operating temperature. Thus, the leak current through a memory cell based on a floating gate MOSFET increases and the threshold voltage at which a conductive state is sensed is lowered. To counterbalance this shift in threshold voltage, the sensing speed can be increased by changing the timing signal provided by the micro-controller 15, which is used to trigger the output latch of a sense amplifier.

During programming or erasing of the memory cell, the pulse width and height used to inject or remove charge carriers to its floating gate are adapted. For example, erasing a memory cell requires a higher voltage potential between a control gate and a source gate, if the operating temperature of the cell is lower. As a consequence, a fixed circuit layout can be used in combination with adapted control signals to effect a temperature independent behavior of the memory cell.

Figure 4:
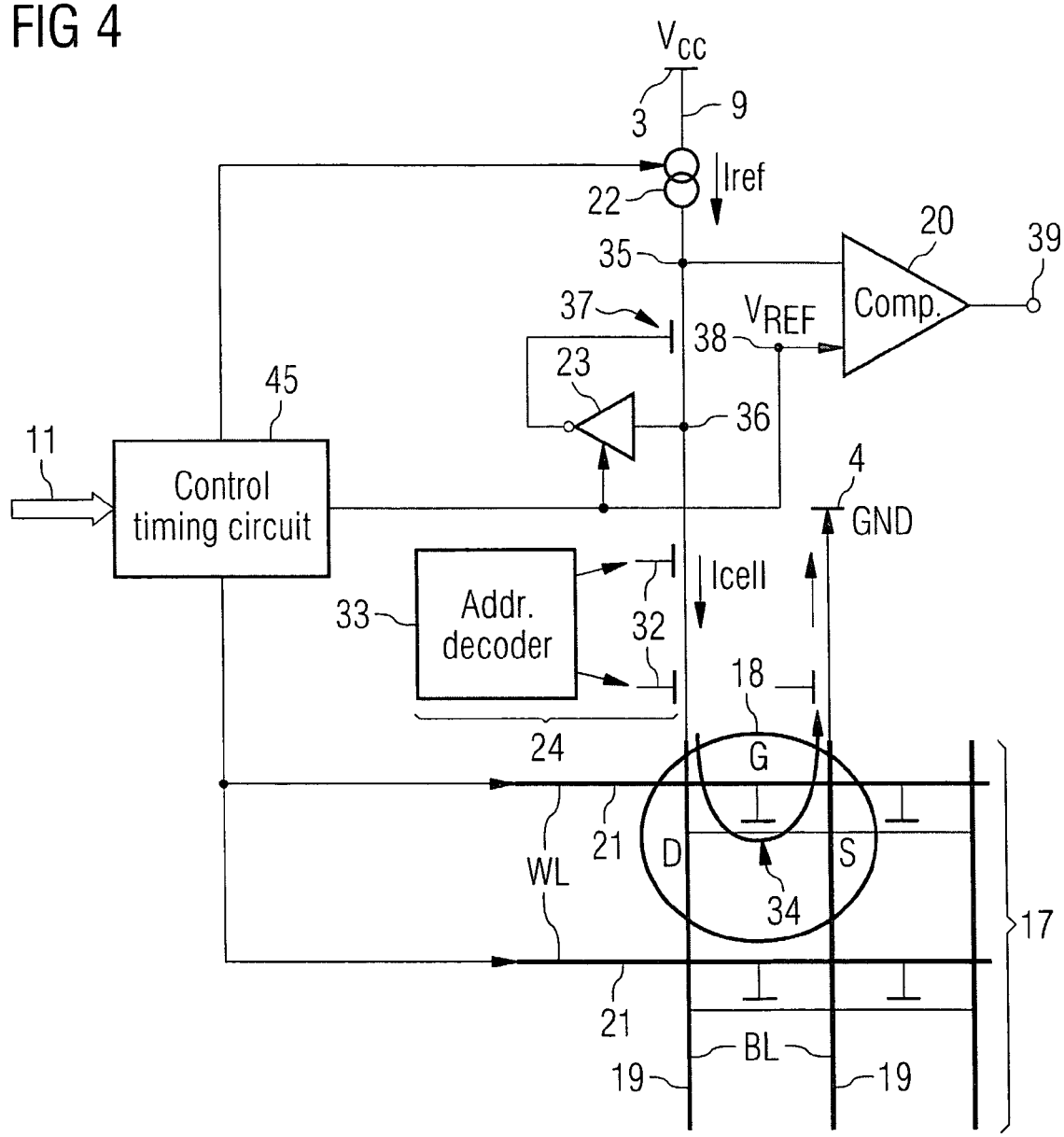
FIG. 4 shows a schematic setup of an array of memory cells with an associated sense amplifier. Different aspects of the circuit can be adjusted by means of control signals received over a communication bus.

FIG. 4 shows a schematic setup of a memory array 17 with several peripheral circuit arrangements. The cell array 17 includes several memory cells 18 which are, for example, MOS transistors 34. Depending on the type of the memory device 1, different kinds of memory cells 18 can be used. For example, floating gate transistors can be used for EEPROM memory devices. Alternatively, an NROM cell can be used, for example in a flash EEPROM memory module, in which a charge can be trapped on a dielectric nitride layer between a control gate and a source-drain channel of the transistor 34. A simple MOSFET transistor in combination with a capacitor can be used for DRAM memory devices. In another embodiment, an MRAM or FeRAM could be used.

The memory cells 18 are arranged in a two-dimensional array 17, each column of the array 17 being coupled by a common bit line 19. Bit lines 19, also called data lines, are used to connect a source and a drain terminal of a memory cell 18 with a fixed voltage potential, for example, electrical ground 4 and the sense amplifier 20, respectively. Word lines 21 are used to select an individual row of the cell array 17, such that by the combination of selecting one row and one column of the cell array 17, an individual memory cell 18 can be selected. The word lines 21 are coupled to the gate terminals of the memory cells 18, thus a voltage supplied to a word line 21 biases the transistor 34.

The circuit arrangement used to sense the current state of a memory cell 18 comprises a comparator 20, a variable reference current source 22, a control amplifier 23 for precharging the bit line 19, and a column decoder 24 used to connect the sense amplifier 20 with the selected bit line 19.

The column decoder 24 usually comprises a number of selection transistors 32 and an address decoder 33. If all switch transistors 32 of the column decoder 24 are closed, the voltage at node 36 is equal to the drain of transistor 34 of the memory cell 18.

After closing the switches of the column decoder 24 a current $I_{CELL}$ starts flowing from the node 36 over the drain and source of the transistor 34 to electrical ground 4. The current $I_{CELL}$ depends on the conductivity of the channel from the drain to the source electrode of the transistor 34. In case of an EEPROM cell based on a floating gate transistor 34, the conductivity depends on the charge that is situated on the floating gate of the memory cell 18. In other words, the current depends on the state of the memory cell 18 if the voltage at node 36 is constant.

For this purpose a control amplifier 23 is provided, which receives at an input the voltage at node 36. The control amplifier 23 controls a further transistor 37, which is coupled between the node 36 and a node 35. The node 35 is also coupled to an input of the comparator 20 and the reference current source 22, which can be adjusted to provide a reference current $I_{REF}$. By means of the control amplifier 23 it is assured that the voltage at node 36 is kept constant, independent of the cell current $I_{CELL}$. Other embodiments of a sense amplifier are possible and subject to the ordinary skills of a person familiar with any kind of memory devices.

The voltage at node 35 depends on the current $I_{CELL}$ and the reference current $I_{REF}$. For example, if the current $I_{CELL}$ is higher than the current $I_{REF}$, the comparator 20 outputs a HIGH-signal at its output 39. Otherwise, the comparator 20 will output a LOW-signal at its output 39. In order to provide a reference level, the comparator 20 has another input to which a reference voltage $V_{REF}$ 38 is applied. Voltage $V_{REF}$ 38 is used as a comparative voltage for the voltages at node 35. It is sized properly according to the dynamic of the node 35.

When the memory cell 18—which is shown as an example for a plurality of memory cells—is read by applying an appropriate gate voltage to the memory cell 18, the cell current $I_{CELL}$ rises due to an increased conductivity of the memory cell 18. This happens under the precondition that the drain-source voltage, which is the voltage at node 36, is kept constant. This is done by sensing the voltage at node 36 and controlling the gate voltage of transistor 37 in order to increase its conductivity. Since the current source 22 remains unchanged the voltage at node 35 decreases.

If the gate voltage applied to the memory cell is high enough that the cell current $I_{CELL}$ becomes greater than a predefined threshold, the voltage at node 35 falls under the voltage $V_{REF}$ and the comparator 20 flips.

In FIG. 4, a control timing circuit 45 coupled to the communication bus 11 is used to control the timing of the variable reference current source 22, the control amplifier 23 for precharging the bit line 19, the reference voltage 23 and the word lines 21. For example, the variable reference current source 22 can be adapted to increase or decrease the current provided by it in order to compensate for a high or low supply voltage 3 provided to it using connection 9.

Alternatively, or in addition, the timing or the signal level of the signal provided to the word lines 21 can be adjusted. It is also possible to adjust the timing of charging the bit line 19 by trimming of the control amplifier 23 or the comparator 20.

In order to allow fast read-access to the array of memory cells 17, the control timing circuit 45 can be implemented using discrete electronic components rather than a programmable micro-controller.

Figure 5:
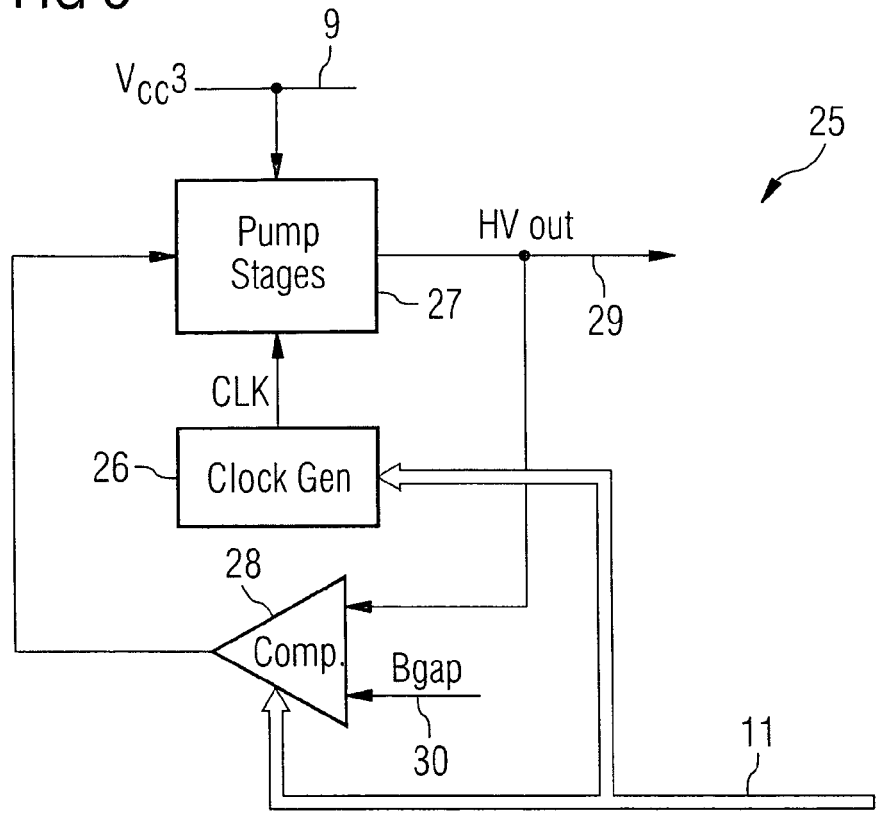
FIG. 5 shows a schematic setup of a high voltage generator. The voltage output can be adapted to the requirements using control signals received from a communication bus.

FIG. 5 shows the schematic setup of a high voltage source 25. The high voltage source 25 comprises a clock generator 26, a pump stage 27, and a comparator 28. The pump stage 27 is connected to the power supply line 9 and the clock generator 26. The signal from the clock generator 26 can be used to generate an internal alternating current in the pump stage 27, which is used to increase the high voltage output 29 of the pump stage 27 to a level above the supply voltage 3 provided over the electrical connection 9. The level of the high voltage output 29 is fed into the comparator 28 and compared with a reference signal 30, and the result of the comparator 28 is fed back into the pump stage 27 for adjustment.

Both the clock generator 26 and the comparator 28 are coupled to the communication bus 11. Consequently, the level of the high voltage output 29 can be controlled by adjusting the clock generator 26 or the comparator 28, for example, by increasing or decreasing the frequency of the clock generator 26 or by providing an offset voltage to the comparator 28. If a constant high voltage output 29 is desired whilst the supply voltage 3 provided over the electrical connection 9 varies, the high voltage source 25 can be adapted to reflect the changed operating conditions.

For example, the clock generator 26 can be operated at a higher frequency for a lower supply voltage 3 and can be operated at a lower frequency for a higher supply voltage 3. In case of a low supply voltage 3, the voltage difference available to the charge pump 27 is lower too. Consequently, the high voltage source 25 is operated at a higher operating frequency in order to achieve a constant high voltage at the output 29.

Figure 6:
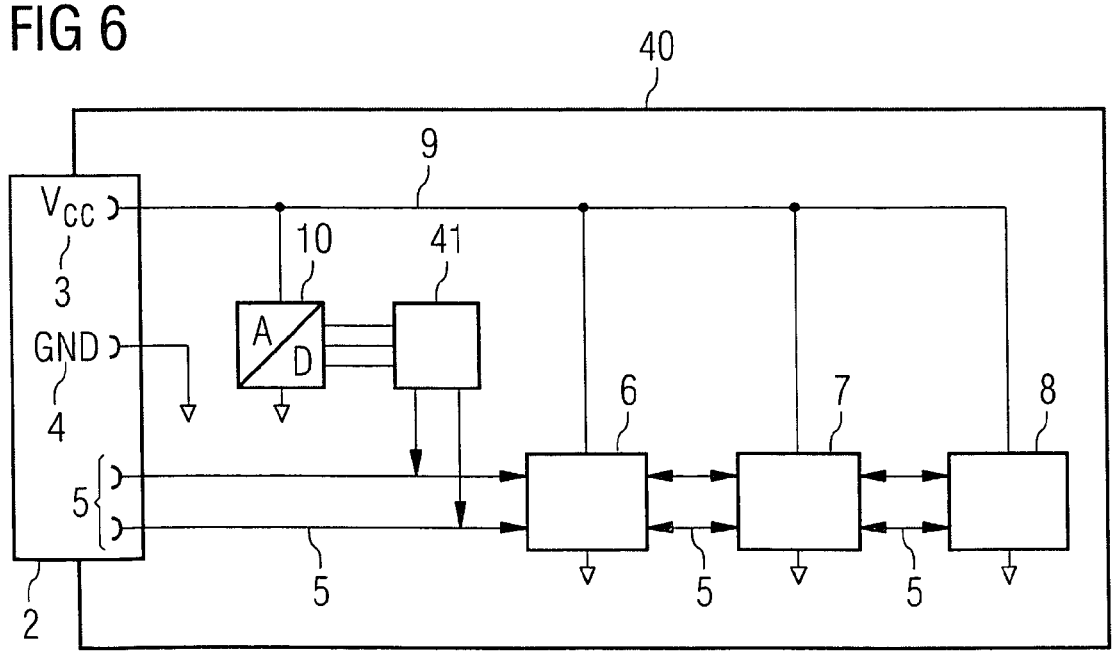
FIG. 6 shows a schematic setup of a second embodiment of the present invention, in which an existing data and control bus is used to transmit control signals for the adaptation of circuit components to a current supply voltage level of a memory module.

FIG. 6 shows another embodiment of the current invention. The setup of a memory device 40 is very similar to that of the memory device 1 presented in FIG. 1 and described herein. However, instead of providing a separate communication bus 11, which is solely used for transmitting the current state of the operating condition sensed and converted by the AD converter 10, a shared communication bus 5 is used, which is also used for communication between the circuit components 6, 7, and 8 and the interface 2. In order to transmit both data and control signals over the communication bus 5 a multiplexing mechanism can be used. For example time division multiplexing can be used, such that at one time the communication bus 5 is dedicated to the transmission of control signals and at another time the communication bus 5 is dedicated to the transmission of data from and to a host system.

To this end a signaling means, for example a micro-controller 41, is used to encode the digital signal received from the AD converter 10 and send it over the common data and control bus 5. The data and control bus 5 acts as the communication bus 11 in this embodiment.

The use of a micro-controller 41 allows to use the AD converter 10 in a passive mode. That is, rather than actively propagating changes of the supply voltage 3 from the AD converter 10 to the circuit components 6, 7 and 8, the circuit components 6, 7 or 8 or the micro-controller 41 can request the current state of the operating condition from the AD converter 10. Alternatively, the supply voltage level 3 can be sampled by the micro-controller 41 at a predefined frequency.

Also, instead of using an analog low pass filter to filter the supply voltage 3 provided to the AD converter 10, the output signal of the AD converter 10 is filtered digitally by the micro-controller 41, e.g., by averaging or performing digital frequency transformations and filtering.

Figure 7:
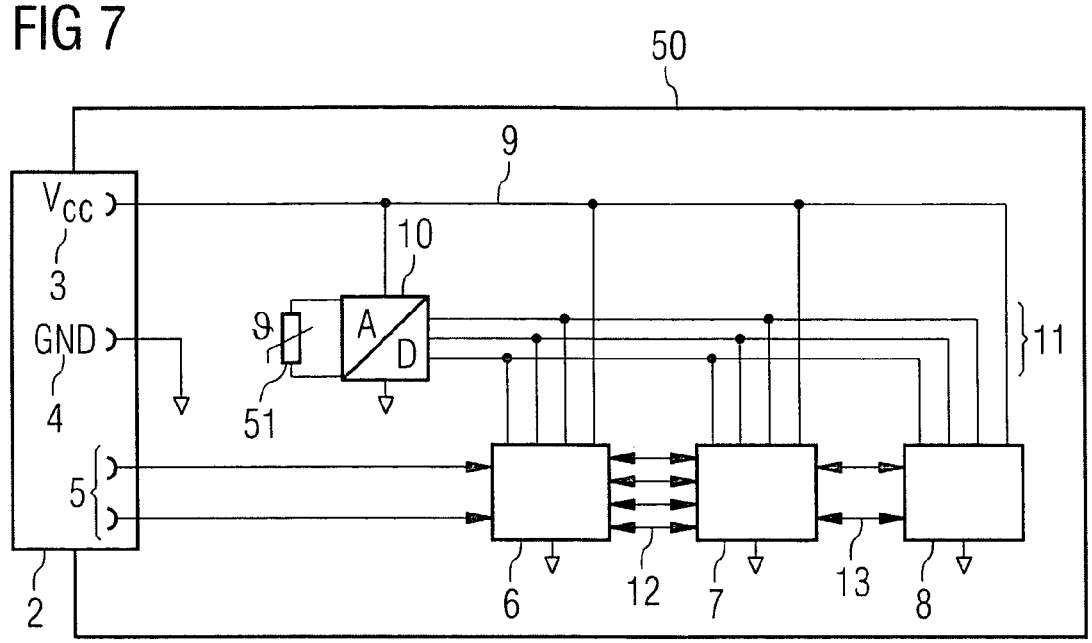
FIG. 7 shows a schematic setup of a third embodiment of the present invention, in which a separate communication bus is used to transmit control signals for the adaptation of circuit components to a current operating temperature of a memory module.

FIG. 7 shows a third embodiment of the present invention. Again the principal architecture of the presented memory module 50 is similar to the one presented in FIG. 1. However, instead of sensing the supply voltage 3 of the memory module 50, its operating temperature is sensed. In the presented embodiment, the resistance of a temperature dependant resistor 51 is measured and digitized by an AD converter 10. The resulting digital value is used as a control signal and provided to circuit components 6, 7, and 8 using communication bus 11. This embodiment can be combined with the implementations of FIGS. 1 and/or 7, if desired.

Figure 8:
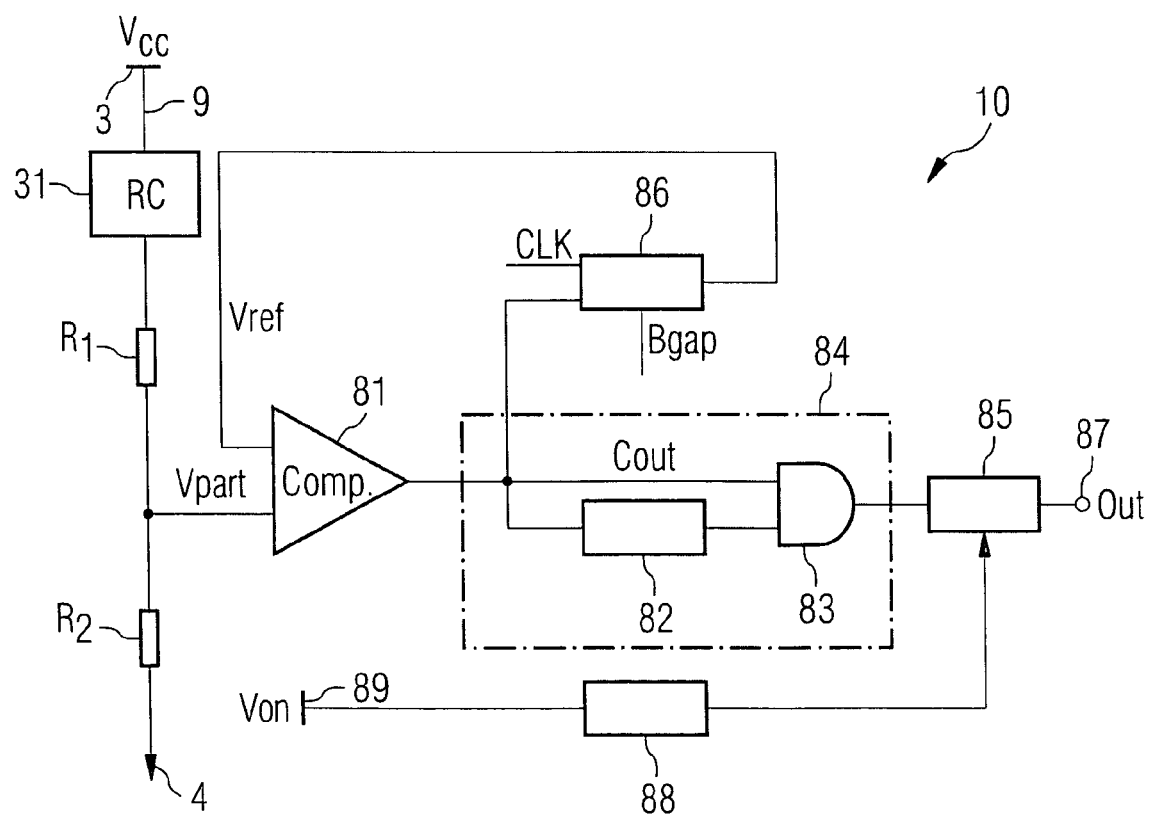
FIG. 8 shows a schematic design of a sensor arrangement, which is used to provide control signals to a communication bus independent of a given supply voltage.

FIG. 8 shows a schematic design of an analog-to-digital conversion circuit 10 as used by the present invention as sensing arrangement for sensing the supply voltage 3. The supply voltage 3 provided over the power line 9 is filtered by an RC circuit 31 acting as a low-pass filter, filtering out glitches and bursts of the supply voltage. The filtered voltage is divided by two resistors $R_1$ and $R_2$ of known resistance. The voltage potential $V_{part}$ between the two resistors is compared with a reference voltage $V_{ref}$ using comparator 81. If the voltage $V_{part}$ lies above the reference voltage, a high voltage signal is provided to the output $C_{out}$ of the comparator 81, which is connected to a delay chain 82 and an AND-gate 83. The delay chain 82 is also connected to the AND-gate 83, together they form a further digital filter 84, which prevents rapid voltage changes to propagate to a latch register 85, which is connected to the output of the AND-gate 83.

The output of the comparator 81 is also fed back to a reference voltage source 86. The reference voltage source 86 generates the reference voltage $V_{ref}$ by means of a known voltage, for example the band gap voltage $B_{gap}$ of a reverse biased semiconductor diode. The reference source 86 also receives a clock signal CLK. For the most significant bit, which is detected first, the reference voltage is set to be exactly in the middle of the anticipated operational voltage range. For the next bit, which is converted during the next clock cycle, the voltage range is halved. If the observed supply voltage was above the middle of the voltage range, i.e., if $C_{out}$ was high during the previous clock cycle, than the new reference voltage $V_{ref}$ is set to be in the middle between the previous upper boundary and the previous reference voltage. In the opposite case, the new reference voltage is set to be in the middle between the lower limit of the previous range and the middle of the previous range. Thus, with each clock cycle the remaining voltage range is halved and a new bit is computed and pushed into the latch register 85.

Once all bits are computed they can be read out at output 87, which is used to provide a control signal associated with the observed supply voltage range to the communication bus 11. In order to avoid reading the latch register 85 before the analog-to-digital conversion is complete, a second delay chain 88 is used to trigger the read-out process. The delay chain 88 and the A/D converter 10 are activated together by means of a control signal $V_{on}$, which can be provided to input 89 either on demand or with a predefined frequency.

Figure 9:
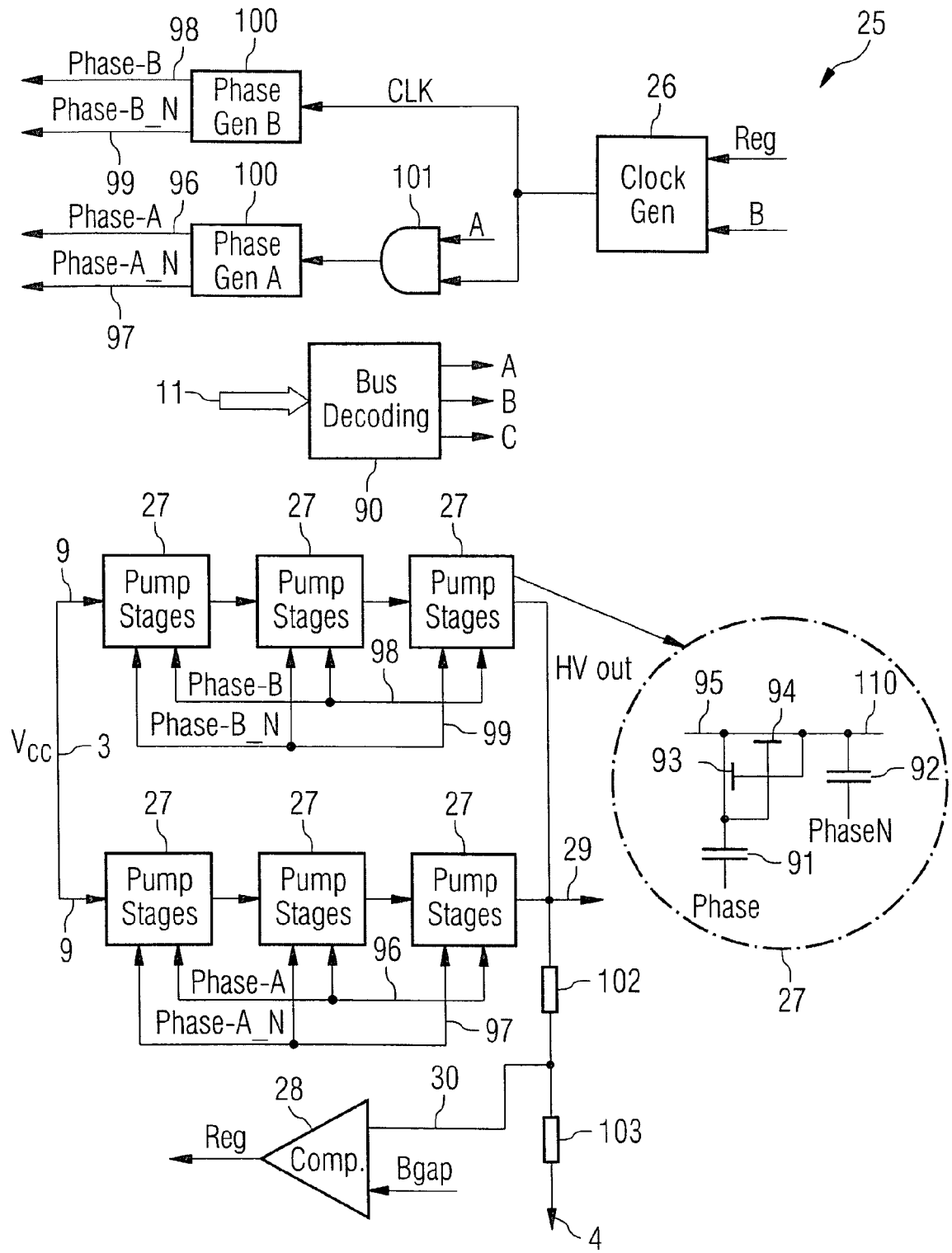
FIG. 9 shows a schematic design of a high voltage pump, which can be adapted by means of control signals received from a communication bus.

FIG. 9 shows a more detailed view of the high voltage source 25, which can be adapted by means of control signals received from the communication bus 11. The high voltage source 25 comprises two parallel chains of pump stages 27 in order to provide the required current. Each chain comprises three pump stages 27 in order to provide the required voltage. The detailed design of a pump stage 27 is shown in the enlarged circle on the right. A pump stage 27 comprises two capacitors 91 and 92 and two switching transistors 93 and 94.

In a first phase, the first capacitor 91 is charged while the discharge current from the second capacitor 92 is added to the voltage from input 95 and provided to the output 110. In a second phase, the second capacitor 92 is charged while the charge stored in the first capacitor 91 is added to the input voltage 95.

The required control signals for the two phases are provided by control lines 96 and 97 for the first chain of pump stages 27 and by means of control lines 98 and 99 for the second chain. These control signals are generated by two phase generators 100 driven by a clock signal from the clock generator 26. The clock signal provided to the first phase generator 100 controlling the first chain of pump stages 27 can be activated or deactivated by means of an AND-gate 101, which is controlled by a control signal A provided by a bus decoder 90.

The bus decoder 90 receives the control signals indicating the current operating conditions of the circuit from the communication bus 11 and provides three control signals A, B and C, of which only the signals A and B are used in the presented example. By means of the control signal A, the current available from the high voltage source 25 can be adapted to the current load. By means of control signal B, the high voltage source can be turned on or off.

The level of the high voltage provided at an output 29 can be adapted by regulating the clock signal provided to the phase generators 100. For this purpose, two resistors 102 and 103 are used to divide the output voltage 29. The voltage between the two resistors 102 and 103 is compared by the comparator 28 with a known reference voltage 30, for example the band gap voltage $B_{gap}$ of a semiconductor diode biased in reverse. The comparator 28 acts as an electronic switch and activates the clock generator 26, if the voltage at the high voltage output becomes too low.

FIG. 10 shows a more detailed design of the clock generator 26, which can be adapted by means of the control signal B decoded by the bus decoder 90. The clock generator 26 comprises a discharge current source 104 and a charge current source 105, each of which can be activated or deactivated by means of the control signal B. The output from the current sources 104 and 105 are used to bias stages 107 of a ring oscillator 106. Essentially the stages 107 form a cascade of inverters, which are driven by the constant current from the current sources 104 and 105. All stages 107 of the ring oscillator 106 are activated using an AND-gate 108, which combines the output signal of the comparator 28 of the high voltage source of FIG. 9 with a feedback signal from the clock output 109 of the ring oscillator 106.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for adapting circuit components to changing operating conditions, the method comprising:
   providing a module that includes integrated circuit chips coupled together by a circuit board;
   sensing a state of an operating condition using a sensing arrangement on the circuit board, wherein the state of the operating condition comprises a state of the input power supply to the module and wherein the input power supply comprises an analog signal; and
   transmitting information related to the sensed state to at least one of the integrated circuit chips, wherein the integrated circuit chips are electrically coupled together via a communication bus, and wherein transmitting information related to the sensed state comprises transmitting a digital signal over the communication bus.

2. The method of claim 1, further comprising mapping the sensed state of the operating condition to one of a number of discrete operating ranges, wherein the information related to the sensed state comprises a digital representation of the one of the discrete operating ranges.

3. The method of claim 2, further comprising adjusting an operating circuit of at least one of the integrated, circuit chips based upon the transmitted information related to the sensed state; and powering the sensing arrangement, the operating circuit and the integrated circuit chips by a common power line.

4. The method of claim 3, wherein sensing the state of the operating condition comprises sensing a supply voltage of the module using the sensing arrangement.

5. The method of claim 3, wherein the module comprises a memory module and wherein at least one of the integrated circuit chips comprises a memory chip.

6. The method of claim 5, wherein the memory chip comprises a non-volatile memory chip.

7. The method of claim 5, wherein another one of the integrated circuit chips comprises a memory controller and wherein transmitting information related to the sensed state to at least one of the integrated circuit chips comprises transmitting the information to at least the memory controller.

8. The method of claim 5, wherein transmitting information related to the sensed state to at least one of the integrated circuit chips comprises transmitting the information to at least the memory chip.

9. The method of claim 1, wherein transmitting information related to the sensed state comprises transmitting a digital signal over a shared data and control bus.

* * * * *